(12) United States Patent
Sharma

(10) Patent No.: US 8,614,602 B2
(45) Date of Patent: Dec. 24, 2013

(54) DIFFERENTIAL AMPLIFIER

(75) Inventor: Abhishek Sharma, Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 86 days.

(21) Appl. No.: 13/250,944

(22) Filed: Sep. 30, 2011

(65) Prior Publication Data

US 2013/0082778 A1  Apr. 4, 2013

(51) Int. Cl.
*H03F 3/45* (2006.01)
(52) U.S. Cl.
USPC .......................................... 330/258; 330/253

(58) Field of Classification Search
USPC .................................. 330/252–265, 267–271
See application file for complete search history.

(56) References Cited

U.S. PATENT DOCUMENTS

| | | | |
|---|---|---|---|
| 6,107,882 A * | 8/2000 | Gabara et al. | 330/253 |
| 6,194,965 B1 * | 2/2001 | Kruczkowski et al. | 330/258 |
| 6,617,925 B2 * | 9/2003 | Hoang | 330/258 |
| 6,630,847 B2 * | 10/2003 | Hunt | 330/258 |

* cited by examiner

*Primary Examiner* — Khanh V Nguyen
(74) *Attorney, Agent, or Firm* — Graybeal Jackson LLP

(57) ABSTRACT

In an embodiment are provided are a differential amplifier, a method of amplifying a differential input signal, a device including a differential amplifier, and a low voltage differential signaling receiver.

39 Claims, 5 Drawing Sheets

DIFFERENTIAL AMPLIFIER

TECHNICAL FIELD

An embodiment broadly relates to a differential amplifier, to a method of amplifying a differential input signal, to a device including a differential amplifier, and to a low voltage differential signaling receiver.

BACKGROUND

A low voltage differential signaling (LVDS) receiver, being compliant with Institute of Electrical and Electronics Engineers (IEEE) and Telecommunications Industry Association/Electronic Industries Alliance (TIA/EIA) standards, is typically capable of receiving a minimum of 100 millivolts (mV) peak to peak voltage swing with a common mode voltage ranging from as low as 50 mV to as high as 2350 mV, while operating on a 2.5V/3.3V supply voltage with a standard variation of about +/−10%. This receiver draws its input voltage across a 100-ohm resistor coupled across its two terminals (e.g. a differential signal with one inverted and one non-inverted input), and coupled to the driver, at a far end, through transmission lines.

The cost of manufacturing such receiver can be reduced e.g. by using thin oxide transistors to design high supply operated circuits. Although the use of thin oxide transistors can reduce the fabrication cost, the risk of oxide breakdown is increased at such high voltages as the thin oxide transistors in the latest technologies are only capable of handling a maximum voltage of around 2.0V between any two terminals of the respective transistors. As a result, the use of such transistors in a high-voltage system demands extra design measures just to ensure that there are no voltages between any two terminals of the respective transistors used in the circuit that are higher than the acceptable limits of the technology. However, the fabrication cost optimization may outweigh the extra circuit cost if the designer can avoid the problem of oxide breakdown.

Moreover, as the input voltage range of an LVDS receiver is up to 2.4 V (as stated in the standards), the LVDS receiver circuit is typically designed to be robust against gate oxide breakdown even if the circuit is in a power saver mode while being present on an active data bus.

FIG. 1 shows a schematic circuit diagram illustrating a conventional self-biased folded cascode differential amplifier 100. Here, the differential amplifier 100 is being biased at a voltage level VDD/2, where VDD is the supply voltage, and VDD/2 is marked as voltage BIAS in FIG. 1. The amplifier 100 includes a biasing sub-circuit 110, which includes n-channel metal-oxide semiconductor (NMOS) transistors NB1, NB2, NB3, NB4, p-channel metal-oxide semiconductor (PMOS) transistors PB1, PB2, PB3, PB4, resistances RB1 and RB2, and output nodes VOP (for non-inverted output) and VOM (for inverted output).

In addition to the bias sub-circuit 110, the conventional cascode amplifier 100 has two sections 130, 120 configured for high and low common mode voltages respectively. Differential input voltages of the circuit, VINP and VINM (where VINP includes the non-inverted input and VINM comprises the inverted input), are applied to each of the sections 130, 120.

The section 120 catering to low common mode voltages includes transistors P1, P2 and PBIAS, and the 'drain' terminals of transistors P1 and P2 are coupled to nodes Y1 and Y2 of the bias sub-circuit 110 respectively. The section 120 is "alive" (i.e. active) at low common mode voltages, and pumps the input-dependent current to the bias sub-circuit 110 for amplification at outputs nodes VOP and VOM. However, the section 120 is "dead" (i.e. inactive) at high common mode voltages.

Similarly, the section 130 catering to high common mode voltages includes transistors N1, N2 and NBIAS and the 'drain' terminals of transistors N1 and N2 are coupled to nodes X1 and X2 of the bias sub-circuit 110 respectively. This section 130 is "alive" (i.e. active) at high common mode voltages, and pumps the input-dependent current to the bias sub-circuit 110 for amplification at outputs nodes VOP and VOM. However, the section 130 is "dead" (i.e. inactive) at low common mode voltages.

The conventional cascode amplifier 100 of FIG. 1 is operable for the entire common mode voltage range, provided that the transistors used are not stressed at higher supply voltages. However, if the maximum stress limit of the transistors is 2.0V, the circuit may be stressed when the amplifier 100 is used to design a 2.5V and/or 3.3V differential LVDS receiver using only thin-oxide 1.8V transistors (capable of handling a maximum of only 2.0V across any two nodes of the transistors). In such circumstances, the supply voltage level VDD is 2.5V or 3.3V, which is at a voltage level higher than the stress limit of 2.0V.

For example, for a low input common mode voltage, while the section 120 including transistors P1, P2 and PBIAS is "alive" when the input common mode voltage is towards ground, transistors N1 and N2 are in the OFF state ("dead") and the voltage level at node VN typically drops down to ground. Since nodes X1 and X2 are at a higher voltage level at that point, transistors N1 and N2 may get stressed, as the voltage across different terminals of the transistors N1, N2, e.g. between drain and source (VDS), between gate and drain (VGD), or between drain and bulk (VDB), may exceed the permissible limits. This stress on transistors N1 and N2 can lead to a transistor breakdown eventually.

Similarly, for a high input common mode voltage, while the section 130 including transistors N1, N2 and NBIAS is "alive" when the input common mode voltage is towards the supply voltage, transistors P1 and P2 are in the OFF state ("dead") and node VP is typically pulled up to supply voltage level. Since nodes Y1 and Y2 are at a lower voltage, transistors P1 and P2 may get stressed as the voltages, e.g. VDS, VGD, VDB may exceed the permissible limits. This stress on P1 and P2 may lead to a transistor breakdown eventually.

Also, when the amplifier 100 is in power saver mode or disable mode, while being present on the active data bus, which is transferring the data at voltages higher than 2.0V, the transistors N1 and N2 get stressed as the voltages between gate and source terminals (VGS) and between the gate and bulk terminals (VGB) may exceed 2.0V.

SUMMARY

A need therefore exists to provide a differential amplifier that seeks to address at least some of the above problems.

In accordance with a first example embodiment, there is provided a differential amplifier including:

first and second input sections configured to receive a differential input signal, the differential input signal including a common mode voltage;

a biasing sub-circuit configured to generate an amplified differential output signal based on signals received from the first and second input sections;

wherein a partial current is steered from one input section to the other input section at a first range of the common mode voltage, and vice versa at a second range of the common mode voltage.

Each input section may be configured to provide a main current to the biasing sub-circuit at the respective ranges of the common mode voltage such that the output signal may be based on a difference between the main current and the partial current.

A magnitude of the partial current may be directly proportional to the common mode voltage.

At the first range of the common mode voltage, a first main current may flow into the biasing sub-circuit through first and second PMOS transistors disposed in the first input section, while a first partial current may flow away from the biasing sub-circuit through third and fourth PMOS transistors disposed in the second input section.

The differential amplifier may further include a negative feedback mechanism for adjusting a magnitude of the first main current for controlling the output signal at the first range of the common mode voltage.

A PMOS bias transistor may be coupled to a supply and to the negative feedback mechanism for controlling the magnitude of the first main current.

At the second range of the common mode voltage, a second main current may flow into the biasing sub-circuit through first and second NMOS transistors disposed in the second input section, while a second partial current may flow away from the biasing sub-circuit through third and fourth NMOS transistors disposed in the first input section.

The differential amplifier may further include a negative feedback mechanism for adjusting a magnitude of the second main current for controlling the output signal at the second range of the common mode voltage.

An NMOS bias transistor may be coupled to a ground and to the negative feedback mechanism for controlling the magnitude of the second main current.

In the first input section, a drain of the first PMOS transistor and a source of the fourth NMOS transistor may be coupled together, while the drain of the second PMOS transistor and the source of the third NMOS transistor may be coupled together.

A non-inverting input of the differential input signal may be applied to gates of the first PMOS transistor and third NMOS transistor, and an inverting input may be applied to gates of the second PMOS transistor and fourth NMOS transistor.

The drains of the first and second PMOS transistors may be coupled to first and second nodes on the biasing sub-circuit via first and second resistors respectively.

The third and fourth NMOS transistors may be configured to conduct the second partial current when the common mode voltage exceeds voltage levels at the first and second nodes by the respective threshold voltages of the third and fourth NMOS transistors.

A third resistor may be coupled between the first node and the ground, while a fourth resistor may be coupled between the second node and the ground respectively.

In the second input section, a drain of the first NMOS transistor and a source of the fourth PMOS transistor may be coupled together, while the drain of the second NMOS transistor and the source of the third PMOS transistor may be coupled together.

A non-inverting input of the differential input signal may be applied to gates of the first NMOS transistor and third PMOS transistor, and an inverting input may be applied to gates of the second NMOS transistor and fourth PMOS transistor.

The drains of the first and second NMOS transistors may be coupled to third and fourth nodes on the biasing sub-circuit via fifth and sixth resistors respectively.

The third and fourth PMOS transistors may be configured to conduct the first partial current when voltage levels at the third and fourth nodes exceed the common mode voltage by the respective threshold voltages of the third and fourth PMOS transistors.

A seventh resistor may be coupled between the third node and a supply source, while an eighth resistor may be coupled between the fourth node and the supply source respectively.

In accordance with a second example embodiment, there is provided a method for amplifying a differential input signal, the method including:

providing the differential input signal to first and second input sections; and generating, at a biasing sub-circuit, an amplified differential output signal based on signals received from the first and second input sections;

wherein the differential input signal includes a common mode voltage, and a partial current is steered from one input section to the other input section at a first range of the common mode voltage, and vice versa at a second range of the common mode voltage.

In accordance with a third example embodiment, there is provided a low voltage differential signaling (LVDS) receiver including:

a differential amplifier;

a comparator configured to receive a differential output signal from the differential amplifier for generating a single ended output signal; and a level shifter circuit configured to receive the single ended output signal for shifting the single ended output signal to a core supply level;

wherein the differential amplifier includes:

first and second input sections configured to receive a differential input signal, the differential input signal including a common mode voltage;

a biasing sub-circuit configured to generate an amplified differential output signal based on signals received from the first and second input sections;

wherein a partial current is steered from one input section to the other input section at a first range of the common mode voltage, and vice versa at a second range of the common mode voltage.

In accordance with a fourth embodiment, there is provided a device including a differential amplifier as defined in the first embodiment.

The device may include a differential receiver, an LVDS receiver, a folded cascode structure, or a differential input stage.

Example embodiments provide a circuit and a method for partial current steering (PCS), i.e. a partial amount of input-dependent current is steered away from the amplifying stage. The steered current is used to maintain voltages at different nodes of the receiver in acceptable ranges.

BRIEF DESCRIPTION OF THE DRAWINGS

One or more embodiments will be better understood and readily apparent from the following written description, by way of example only, and in conjunction with the drawings, in which.

DETAILED DESCRIPTION

Figure 1:
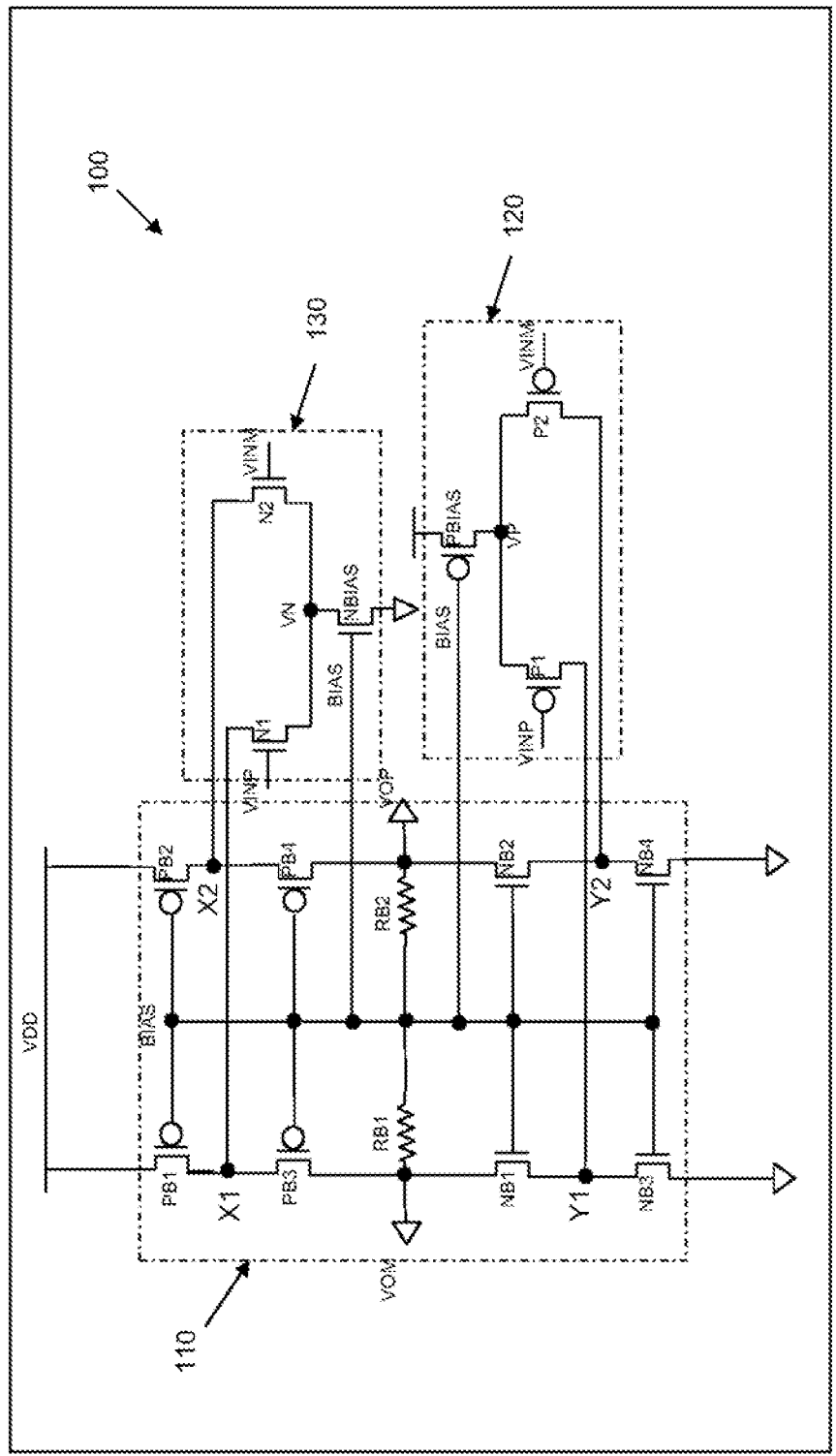
FIG. 1 shows a schematic circuit diagram illustrating a conventional self-biased folded cascode differential amplifier.
Figure 2:
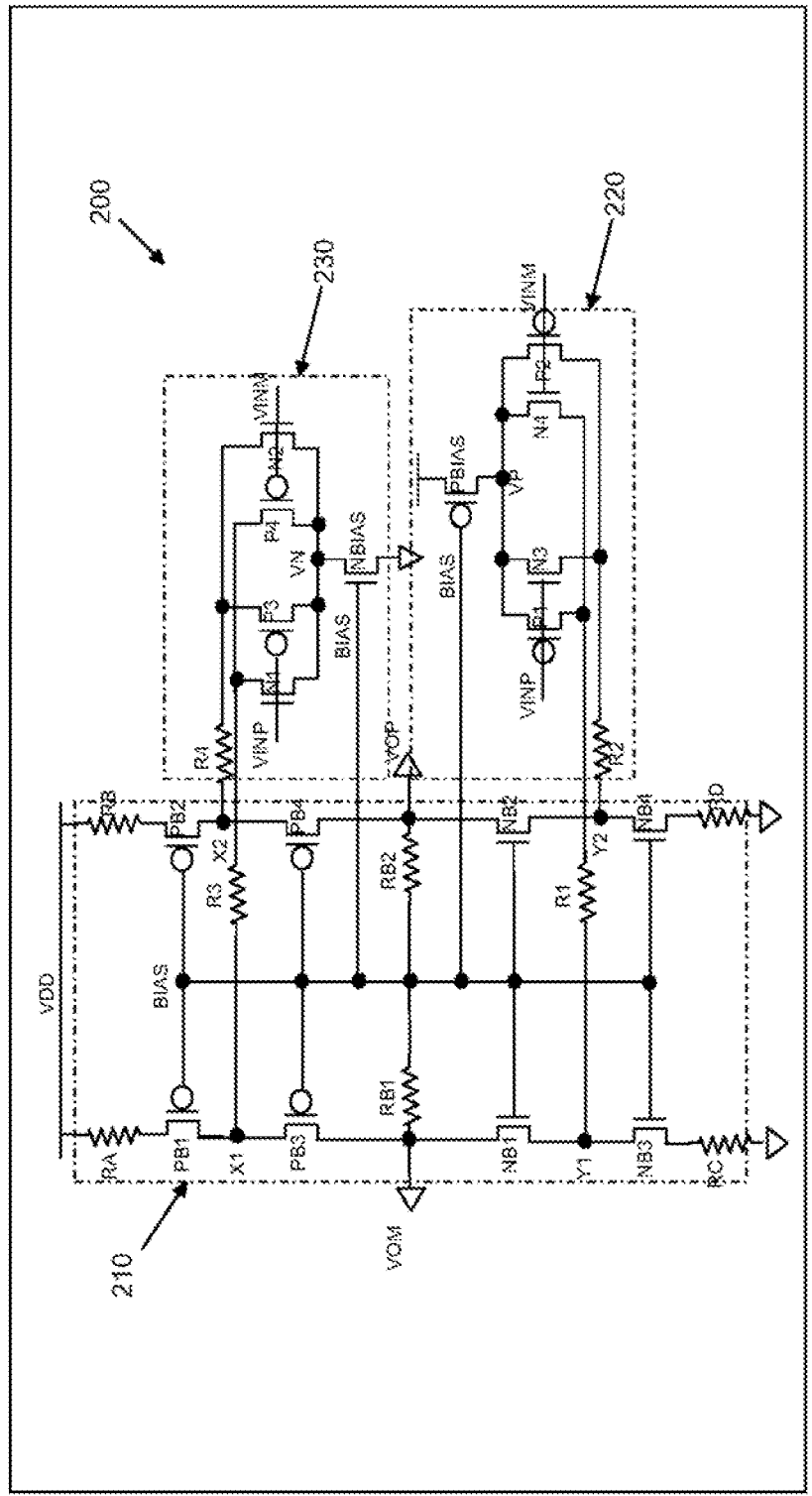
FIG. 2 shows a schematic circuit diagram illustrating a self-biased folded cascode differential amplifier according to an example embodiment.

FIG. 2 shows a schematic circuit diagram illustrating a self-biased folded cascode differential amplifier 200 according to an example embodiment. Like the differential amplifier of FIG. 1, the differential amplifier 200 is biased at a voltage level VDD/2, where VDD is the supply voltage, and VDD/2 is marked as voltage BIAS in FIG. 2. The amplifier 200 includes a biasing sub-circuit 210 which includes n-channel metal-oxide semiconductor (NMOS) transistors NB1, NB2, NB3, NB4, p-channel metal-oxide semiconductor (PMOS) transistors PB1, PB2, PB2, PB4, resistances RB1 and RB2, and output nodes VOP (for non-inverted output) and VOM (for inverted output). Additionally, the sub-circuit 210 includes resistors RA, RB, RC, RD disposed such that resistor RA is coupled between transistor PB1 and the supply, resistor RB is coupled between transistor PB2 and the supply, resistor RC is coupled between transistor NB3 and the ground, and resistor RD is coupled between transistor NB4 and the ground.

In addition to the biasing sub-circuit 210, the cascode differential amplifier 200 includes two sections 230, 220 configured to be active at both high and low common mode voltages in an example embodiment. Differential input voltages VINP and VINM of the circuit (where VINP includes the non-inverted input and VINM includes the inverted input) are applied to each of the sections 230, 220.

Section 220 includes PMOS transistors P1, P2 and PBIAS and NMOS transistors N3, N4. In an example embodiment, the NMOS transistors N3 and N4 are cross-coupled to the PMOS transistors P1 and P2. For example, the drain of transistor P1 and the source of transistor N4 are coupled together, and then coupled to node Y1 of the biasing sub-circuit 210 via resistor R1. Also, the drain of transistor P2 and the source of transistor N3 are coupled together, and then coupled to node Y2 of the biasing sub-circuit 210 via resistor R2. Such cross-coupling can help in improving the transient gain to some extent in an example embodiment (as will be described in detail below). The non-inverted input voltage VINP is applied to transistors P1 and N3, while the inverted input voltage VINM is applied to transistors P2 and N4, as shown in FIG. 2.

Similarly, section 230 includes NMOS transistors N1, N2 and NBIAS, and PMOS transistors P3, P4. In an example embodiment, the PMOS transistors P3 and P4 are cross-coupled to the NMOS transistors N1 and N2. For example, the drain of transistor N1 and the source of transistor P4 are coupled together, and then coupled to node X1 of the biasing sub-circuit 210 via resistor R3. Also, the drain of transistor N2 and the source of transistor P3 are coupled together, and then coupled to node X2 of the biasing sub-circuit 210 via resistor R4. Such cross-coupling can help in improving the transient gain to some extent in an example embodiment (as will be described in detail below). The non-inverted input voltage VINP is applied to transistors N1 and P3, while the inverted input voltage VINM is applied to transistors N2 and P4, as shown in FIG. 2.

The cascode amplifier 200 according to an example embodiment is operable for the entire common mode voltage range, and prevents the thin-oxide transistors from being stressed even at higher supply voltages. The amplifier 200 has both sections 220, 230 "alive" (i.e. active) over the entire common mode voltage range, unlike the conventional amplifier of FIG. 1.

In the example embodiment, the additional circuitry as described above is used to prevent stresses on transistors N1, N2, P1 and P2 when they are in the "OFF" state, such that the potential risk of oxide breakdown and hence failure may be averted. The circuitry also helps to ensure that the differential amplifier 200 can safeguard itself from the active data at voltages greater than stress limits, while being in the power-saver or disable mode and coupled to the active data bus. For example, by employing the partial current steering (PCS) technique, a partial current is steered away from the biasing sub-circuit 210 to avoid stress on transistors N1 and N2, P1 and P2 when they are in the "OFF" state, as discussed in detail below.

With reference to FIG. 2, in the biasing sub-circuit 210, resistors RA, RB, RC and RD are added to drop down voltages at nodes X1 and X2 and lift up voltages at nodes Y1 and Y2. These resistors help in avoiding stress on transistors N1, N2, P1 and P2. Apart from this, these resistors also help in de-coupling the source voltages of transistors PB1, PB2, NB3 and NB4, which may help in providing negative feedback acting for common mode correction (to be described in detail below).

Low Common Mode Input Voltage

For a low common mode input voltage, the voltage level at node VN is not allowed to drop down to ground, and is lifted up to a level that can avoid stress on transistors N1 and N2 in the example embodiment. The lifting of the voltage level at node VN may be independent of the input voltage applied, and may be governed by the amount of uplifting required to avoid stress on transistors N1 and N2, e.g. depending on the voltage levels at nodes X1 and X2.

As described above, transistors P3 and P4 are provided at section 230 in an example embodiment. During the entire range of the common mode voltage, transistors N1, N2, P3 and P4 help to lift the voltage level at node VN, with N1 and N2 acting during high common mode input voltages, and P3 and P4 during low common mode input voltages. The sizes of the transistors N1, N2, P3 and P4 can be selected based on the stress-free requirement.

For example, the sizes of these additional transistors are selected such that the currents through these transistors are sufficient to pull up the voltage level at node VN to a value that avoids stress on the main transistors. Typically, a ratio of the sizes can be selected based on application requirements. In one example implementation, a ratio of about 6 between the sizes of main and additional transistors has been taken. In other words, the ratio of the sizes of N1/N2 to N3/N4 is about 6 (sizes of N1 and N2 are the same, and sizes of N3 and N4 are the same), and similarly, the ratio of the sizes of P1/P2 to P3/P4 is about 6 (sizes of P1 and P2 are the same, and sizes of P3 and P4 are the same). Here, example suitable sizes (width× length) are about 2.1 μm×0.3 μm for N1/N2, and 0.8 μm×0.3 μm for P3/P4.

Moreover, resistors R3 and R4 are also provided in the example embodiment to help in avoiding stresses on transistors N1 and N2, as these transistors split voltages when the current is drawn through them.

In the example embodiment, transistors P1 and N3 are given the non-inverted input voltage VINP, and transistor P2 and N4 are given inverted input voltage VINM. Also, as described above, the NMOS and PMOS transistors in section 220 are cross-coupled.

Hence, in the example embodiment, for a low common mode input voltage, there are two current paths: a main current IP1 that flows through transistors PBIAS, P1 and P2, similar to that in a conventional self-biased cascode differential amplifier 100 explained earlier (FIG. 1), and a steered current IP2 to avoid stresses that flows through transistors P3, P4 and NBIAS. The difference of the two currents, IP1-IP2, is ultimately fed to the biasing stage of the biasing sub-circuit 210 in the example embodiment. Also, due to the presence of resistors RA and R3 in the circuit, the voltage level at node X1 is reduced compared to that in FIG. 1. Similarly, due to the presence of resistors RB and R4 in the circuit, the voltage level at node X2 is reduced compared with that in FIG. 1. Thus, the stress to transistors N1 and N2 is substantially reduced or prevented.

High Common Mode Input Voltage

For a high common mode input voltage, the voltage level at node VP is not allowed to pull up to the supply voltage, and is pulled down to a level that can avoid stress on transistors P1 and P2 in an example embodiment. The pulling down of the voltage level at node VP may be independent of the input voltage applied, and may be governed by the amount of drop required to avoid stress on transistors P1 and P2, e.g. depending on the voltage levels at nodes Y1 and Y2.

As described above, transistors N3 and N4 are provided at section 220 in an example embodiment. During the entire range of the common mode voltage, transistors P1, P2, N3 and N4 help to pull down the voltage level at node VP, with P1 and P2 acting during low common mode input voltages, and N3 and N4 during high common mode input voltages. The sizes of the transistors P1, P2, N3 and N4 can be selected based on a stress-free requirement.

For example, the sizes of these additional transistors are selected such that the currents through these transistors are sufficient to pull down the voltage level at node VP to a value that avoids stress on the main transistors. Typically, a ratio of the sizes can be selected based on application requirements. In one example implementation, a ratio of about 6 between the sizes of the main and additional transistors has been taken. In other words, the ratio of the sizes of N1/N2 to N3/N4 is about 6 (sizes of N1 and N2 are the same, and sizes of N3 and N4 are the same); and similarly, the ratio of the sizes of P1/P2 to P3/P4 is about 6 (sizes of P1 and P2 are the same, and sizes of P3 and P4 are the same). Here, example suitable sizes (width×length) are about 5 μm×0.3 μm for P1/P2, and 0.8 μm×0.71 μm for N3/N4.

Moreover, resistors R1 and R2 are also provided in the example embodiment to help in avoiding stresses on transistors P1 and P2, as these transistors split voltages when the current is drawn through them.

In an example embodiment, transistors N1 and P3 are given the non-inverted input voltage VINP, and transistor N2 and P4 are given the inverted input voltage VINM. Also, as described above, the NMOS and PMOS transistors in section 230 are cross-coupled.

Hence, in an example embodiment, for a high common mode input voltage, there are two current paths: a main current IN1 that flows through transistors NBIAS, N1 and N2, similar to that in a conventional self-biased cascode differential amplifier 100 explained earlier (FIG. 1), and a steered current IN2 to avoid stresses that flows through transistors N3, N4 and PBIAS. The difference of the two currents, IN1-IN2, is fed to the biasing stage of the biasing sub-circuit 210 in the example embodiment. Also, due to the presence of resistors RC and R1 in the circuit, the voltage level at node Y1 is increased compared to that in FIG. 1. Similarly, due to the presence of resistors RD and R2 in the circuit, the voltage level at node Y2 is increased compared with that in FIG. 1. Thus, the stress to transistors P1 and P2 is substantially reduced or prevented.

With reference to FIG. 2, the current flows for a high common mode input voltage is are now described. It will be appreciated that the current flows for a low common mode input voltage can be similarly derived, as the circuit in FIG. 2 is symmetrical.

Current Path for Main Current IN1:

For example, consider a high common mode input voltage VINP and VINM such that section 230 is alive (i.e. active) (not considering the actions of transistors N3 and N4 right now, as they will be described below). Suppose the common mode is around about 1.5 V and starts to rise towards 2.4V. As the common mode input rises, NMOS transistors N1 and N2 extract more common mode current (IN1) from the biasing sub-circuit 210 through nodes X1 and X2, then through transistor NBIAS to ground. As the current increases that goes through NMOS transistors N1 and N2, the voltages VOP and VOM drop, hence the bias voltage BIAS drops because of the common mode feedback provided by resistors RB1 and RB2. This reduces the voltage across the gate and source terminals (VGS) of transistor NBIAS, hence the current flowing through it, and acts as a negative feedback mechanism for correcting the input common mode to a stable output common mode (at voltage levels VOP and VOM respectively), which is set to approximately supply divided by 2 (i.e. VDD/2) with the help of transistors in the biasing sub-circuit 210 (PB1-PB4 and NB1-NB4). Thus, in an example embodiment, the self biasing technique helps in providing a strong negative feedback mechanism and reducing dynamic current consumption.

Here, resistors RA and RB act as source de-coupling resistors and de-couple the voltages between the gate and the source (VGS) of transistors PB1 and PB2, apart from lowering down the voltage levels at nodes X1 and X2 to some extent to avoid stresses on transistors N1 and N2. Resistors R3 and R4 help splitting voltages for avoiding stress as the current is drawn through them.

Now consider some differential voltage on this common mode input, with voltage VINP having a positive swing value and voltage VINM having a negative swing value. Thus, the voltage level at node X1 falls and the voltage level at node X2 rises differentially, and voltage level VOM falls and voltage level VOP rises to values defined by the gain of the biasing sub-circuit 210 (e.g. primarily defined by the resistances of resistors RB1 and RB2, as the resistances of RB1 and RB2 are typically very low and come in parallel to the output resistances of the transistors, PB1-PB4 and NB1-NB4, which are coupled in a cascode fashion). However, voltage level BIAS does not change due to common mode detection by resistors RB1 and RB2 (assuming they are matched).

Current Path for Steered Current IN2:

The impact of NMOS transistors N3 and N4 is now considered with reference to section 220. During the high common mode input voltage, NMOS transistors N3 and N4 conduct, drawing a current from the supply through transistor PBIAS and pulling down the voltage level at node VP. This is the steered current IN2 supplied to the biasing stage 210 through nodes Y1 and Y2. Thus, in an example embodiment, the current through transistors NB1 and NB2 is reduced to (IN1-IN2) because the current through NB3 and NB4 remains relatively constant due to constant biasing conditions and thereby reducing the dynamic gain of the circuit. However, the steered current IN2 helps maintaining the stress free environment. Typically, the current is significantly less than the main current IN1, and is set as per requirement to avoid stresses on the transistors.

In section 220, transistors N3 and N4 are coupled in a cross-coupled fashion to transistors P1 and P2, as mentioned above. Resistors R1 and R2 are coupled between nodes Y1 and Y2 of the biasing sub-circuit 210 and respective nodes of P1/N3 and P2/N4 in section 220. These resistances R1 and R2 split up the voltages when current is drawn through them and avoid stress on the transistors.

For example, if voltage VINP is going up differentially and voltage VINM is going down differentially, during this differential transition, the voltage level at node Y1 will go down and the voltage level at node Y2 will go up as determined by the currents. At this time, transistor N3 starts drawing current from the supply, which is at voltage level VDD, through transistor PBIAS and provides this current to the biasing circuit 210 through Y2, thereby pulling down the voltage level at node VP and slightly pulling up the voltage level at node Y2 (as the voltage level at node Y2 is very low compared to voltage VINP, and assuming voltage VGS of transistor N3 is greater than its threshold voltage VT), while voltage level at node Y1 is pulled down differentially in a similar fashion. Hence, in an example embodiment, the transient differential swing, and therefore gain, is slightly improved. Also, resistors R1/R2 split voltages more as more current is drawn from them, thus, avoiding stress on the transistors P1, N3, P2 and N4 involved.

Thus, the higher is the common mode input voltage, the larger is the current steered (IN2) to avoid stress, thereby, making the circuit stress free, depending on the input voltage. However, since the ratio of the transistors is set, the main current IN1 and steered current IN2 rise in the same ratio, thereby catering to wider values of common mode voltages. Since transistors N3 and N4 are in the ON state only when the common mode input voltage VINP/VINM exceeds the voltages at node Y1/Y2 by the threshold voltage VT of transistor N3/N4, there is no steering of current in middle common mode range, where there is no requirement of avoiding stress at all, thereby saving power where not required.

On the other hand, when the differential amplifier 200 is in the power saver mode or disable mode, while being present on the active data bus (which is transferring the data at voltages higher than 2.0V), the transistors N1 and N2 may get stressed as VGS and VGB may exceed 2.0V. To avoid this, in an example embodiment, all the current consumption paths are opened and floating nodes X1, X2, Y1 and Y2 are pulled up to a reference voltage of e.g. 2.0V, which can be generated from the supply in the example embodiment. For example, the biasing sub-circuit 210 is opened by way of switches (not shown in FIG. 2), and by pulling down the voltage level at the gate of transistor NBIAS and pulling up the voltage level at the gate of transistor PBIAS. The reference voltage of 2.0V can be generated, e.g. though a potential divider (not shown in FIG. 2). Since the sections 220, 230 catering to the high and low common mode voltage ranges contain sets of both NMOS and PMOS transistors, the voltage levels at nodes VN and VP get set to this reference voltage for the entire input range, thereby avoiding any voltages greater than 2.0V and stress caused thereby.

The differential amplifier according to an example embodiment can reduce the risk of reliability issues as the transistors used in the design are substantially stress free. It is also a cost effective solution as it uses thin oxide transistors for high supply voltage operations and can make use of the existing design. Even in the power saver or disable mode, the receiver according to an example embodiment advantageously is able to withstand the entire input range. Furthermore, an embodiment of the circuit is self-adjusting based on the input, thus ensuring no stress on any of the transistors used. Also, in example embodiments, the gain is relatively constant over the entire range of input, helping in reducing the glitches due to sudden change of common mode.

Figure 3:
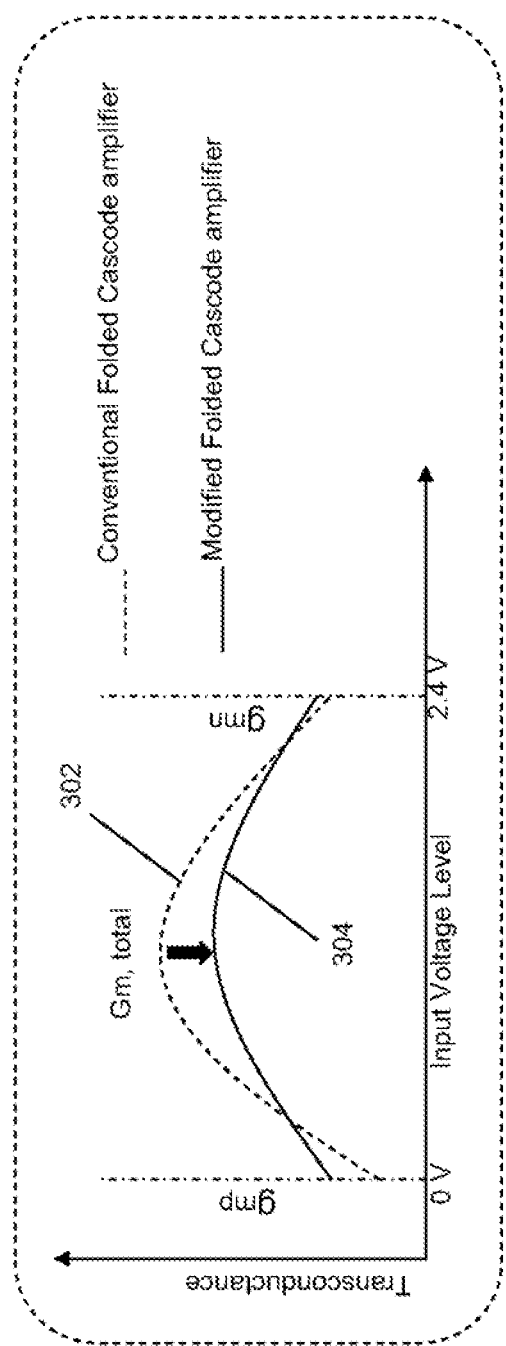
FIG. 3 shows graphs comparing transconductance of a conventional folded cascade amplifier and transconductance of the amplifier according to the example embodiment.

FIG. 3 shows graphs comparing transconductance of a conventional folded cascade amplifier (as illustrated by line 302) and transconductance of the amplifier according to the example embodiment (as illustrated by line 304). As can be seen from FIG. 3, line 304 is significantly more flat (i.e. more constant gain) compared to line 302.

In another example embodiment, the use of resistors R1-R4 in the differential amplifier may be optional, depending on e.g. the stress requirements for the transistors. Similarly, the use of resistors RA-RD is optional in another example embodiment, depending on e.g. the stress requirements for the transistors and the feedback to be achieved within the circuit. Also, the cross-coupling of transistors (P1 and N4, P2 and N3, N1 and P4, N2 and P3) is optional in another example embodiment, depending on e.g. the gain achieved in the circuit. In other words, while the additional transistors (N3, N4, P3 and P4) are typically necessary for implementing the partial current steering technique in the example embodiments, the other additional circuit components and the circuit arrangement may be varied to achieve the desired performance, e.g. gain, stress prevention, etc.

It will be appreciated that the differential amplifiers described in the example embodiments can be applied in many different applications and devices, including but not limited to e.g. an LVDS receiver, a differential amplifier/receiver (externally biased or self-biased) that is made using stress avoided thin-oxide transistors and working at higher supplies, a folded cascode structure or differential amplifier that avoids stress, and a differential input stage that withstands input voltages greater than stress limits.

Figure 4:
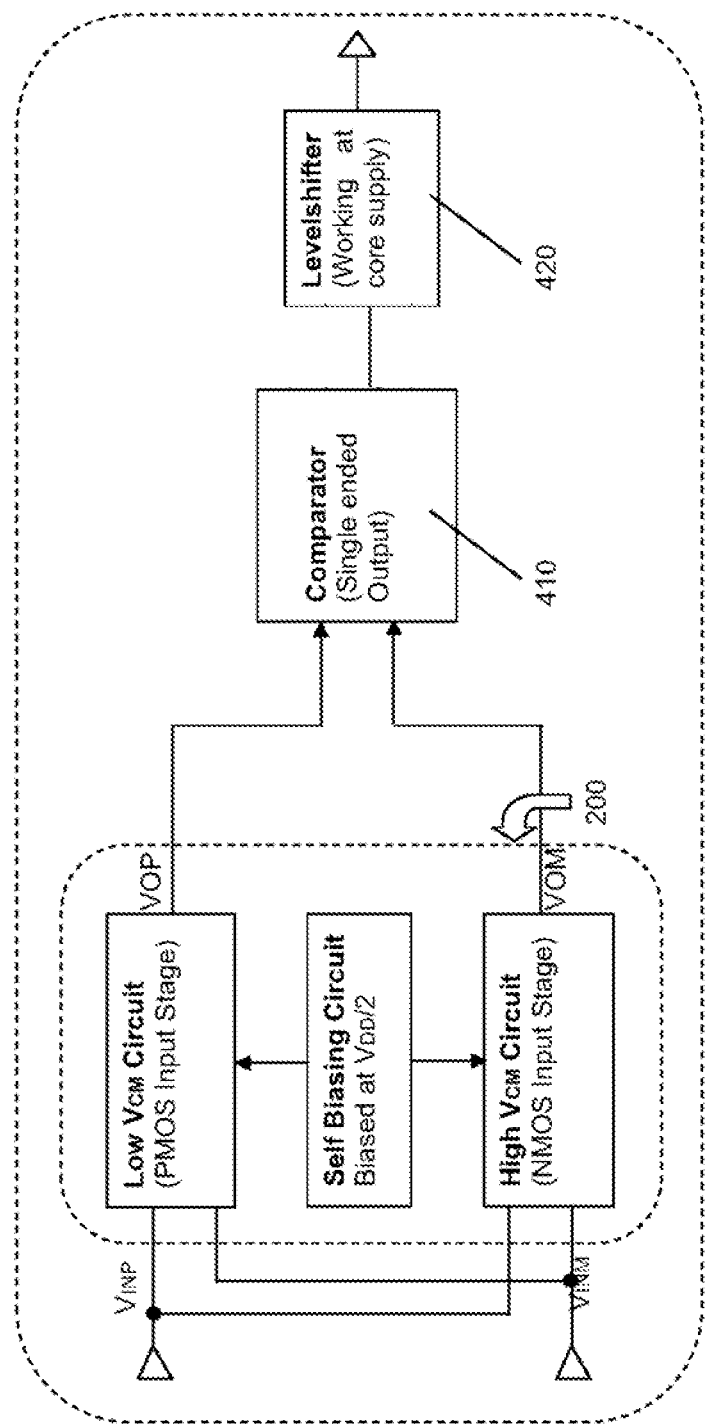
FIG. 4 shows a block diagram illustrating an LVDS receiver employing the differential amplifier according to an example embodiment.

FIG. 4 shows a block diagram illustrating an LVDS receiver 400 employing the differential amplifier 200 (FIG. 2) according to an example embodiment. As can be seen from FIG. 4, the differential outputs VOP, VOM of the differential amplifier 200 are fed to a comparator 410, which produces a single ended output, which is then provided to and level-shifted by a level shifter circuit 420 to the core supply level.

The LVDS receiver according to an example embodiment is IEEE and TIA/EIA standards compliant and able to prevent stresses on relevant nodes, and ensures a stress-free environment both in the active and power saver mode, while being present on the data bus. Advantageously, an embodiment of the circuit can re-use parts of the existing folded cascode methodology with self-biasing.

Figure 5:
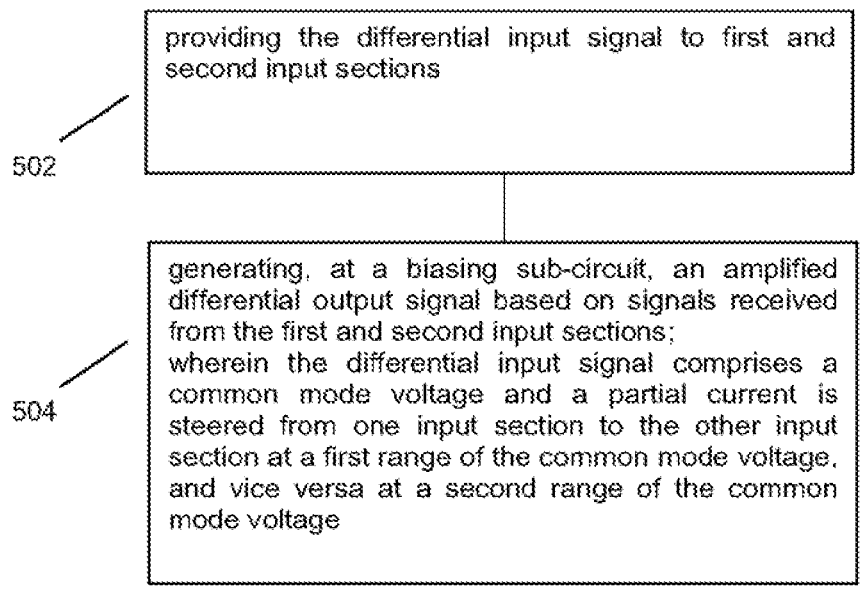
FIG. 5 shows a flow chart illustrating a method for amplifying a differential input signal according to an example embodiment.

FIG. 5 shows a flow chart 500 illustrating a method for amplifying a differential input signal according to an example embodiment. At step 502, the differential input signal is provided to first and second input sections. At step 504, an amplified differential output signal is generated at a biasing sub-circuit based on signals received from the first and second input sections; wherein the differential input signal includes a common mode voltage and a partial current is steered from one input section to the other input section at a first range of the common mode voltage, and vice versa at a second range of the common mode voltage.

While this detailed description has set forth some embodiments, other embodiments are contemplated according to various modifications and improvements. For example, the resistance values of the various resistors may be adjusted based on e.g. the stress limit of the transistors, or the resistors can be dropped, if not required as per stress requirements; the gain of the amplifier may be compensated due to the additional circuit components e.g. by changing resistances of RB1 and RB2 and the bias current through transistors PB1-4 and NB1-4. Also, it may be possible to use such a technique in gain amplifiers, devised using external biasing techniques. Also, it may be possible to adjust the common mode output of voltages VOM and VOP by adjusting resistors RA-RD and transistors PB1-4 and NB1-4; ratio and values of transistors P3-P4 and N3-N4 with respect to P1-P2 and N1-N2 respectively to avoid stress at higher and different voltages.

Within the appended claims, unless the specific term "means for" or "step for" is used within a given claim, it is not intended that the claim be interpreted under 35 U.S.C. 112, paragraph 6.

The receiver of FIG. 4 may be coupled to an integrated circuit to form a system. For example, the integrated circuit may be a controller such as a processor disposed on the same or a different die relative to the receiver.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A differential amplifier comprising:
   first and second input sections configured to receive a differential input signal, the differential input signal including a common mode voltage;
   a biasing sub-circuit configured to generate an amplified differential output signal based on signals received from the first and second input sections;
   wherein a partial current is steered from one input section to the other input section at a first range of the common mode voltage, and vice versa at a second range of the common mode voltage.

2. The differential amplifier as claimed in claim 1, wherein each input section is configured to provide a main current to the biasing sub-circuit at the respective ranges of the common mode voltage such that the output signal is based on a difference between the main current and the partial current.

3. The differential amplifier as claimed in claim 1, wherein a magnitude of the partial current is directly proportional to the common mode voltage.

4. A differential amplifier comprising:
   first and second input sections configured to receive a differential input signal, the differential input signal including a common mode voltage;
   a biasing sub-circuit configured to generate an amplified differential output signal based on signals received from the first and second input sections;
   wherein a partial current is steered from one input section to the other input section at a first range of the common mode voltage, and vice versa at a second range of the common mode voltage;
   wherein each input section is configured to provide a main current to the biasing sub-circuit at the respective ranges of the common mode voltage such that the output signal is based on a difference between the main current and the partial current; and
   wherein, at the first range of the common mode voltage, a first main current flows into the biasing sub-circuit through first and second PMOS transistors disposed in the first input section, while a first partial current flows away from the biasing sub-circuit through third and fourth PMOS transistors disposed in the second input section.

5. The differential amplifier as claimed in claim 4, further including a negative feedback mechanism for adjusting a magnitude of the first main current for controlling the output signal at the first range of the common mode voltage.

6. The differential amplifier as claimed in claim 5, wherein a PMOS bias transistor is coupled to a supply and to the negative feedback mechanism for controlling the magnitude of the first main current.

7. The differential amplifier as claimed in claim 4, wherein, at the second range of the common mode voltage, a second main current flows into the biasing sub-circuit through first and second NMOS transistors disposed in the second input section, while a second partial current flows away from the biasing sub-circuit through third and fourth NMOS transistors disposed in the first input section.

8. The differential amplifier as claimed in claim 7, further including a negative feedback mechanism for adjusting a magnitude of the second main current for controlling the output signal at the second range of the common mode voltage.

9. The differential amplifier as claimed in claim 8, wherein an NMOS bias transistor is coupled to a ground and to the negative feedback mechanism for controlling the magnitude of the second main current.

10. The differential amplifier as claimed in claim 7, wherein, in the first input section, a drain of the first PMOS transistor and a source of the fourth NMOS transistor are coupled together, while the drain of the second PMOS transistor and the source of the third NMOS transistor are coupled together.

11. The differential amplifier as claimed in claim 10, wherein a non-inverting input of the differential input signal is applied to gates of the first PMOS transistor and third NMOS transistor, and an inverting input is applied to gates of the second PMOS transistor and fourth NMOS transistor.

12. The differential amplifier as claimed in claim 10, wherein the drains of the first and second PMOS transistors are coupled to first and second nodes on the biasing sub-circuit via first and second resistors respectively.

13. The differential amplifier as claimed in claim 12, wherein the third and fourth NMOS transistors are configured to conduct the second partial current when the common mode voltage exceeds voltage levels at the first and second nodes by the respective threshold voltages of the third and fourth NMOS transistors.

14. The differential amplifier as claimed in claim 12, wherein a third resistor is coupled between the first node and the ground, while a fourth resistor is coupled between the second node and the ground respectively.

15. The differential amplifier as claimed in claim 7, wherein, in the second input section, a drain of the first NMOS transistor and a source of the fourth PMOS transistor are coupled together, while the drain of the second NMOS transistor and the source of the third PMOS transistor are coupled together.

16. The differential amplifier as claimed in claim 15, wherein a non-inverting input of the differential input signal is applied to gates of the first NMOS transistor and third PMOS transistor, and an inverting input is applied to gates of the second NMOS transistor and fourth PMOS transistor.

17. The differential amplifier as claimed in claim 15, wherein the drains of the first and second NMOS transistors are coupled to third and fourth nodes on the biasing sub-circuit via fifth and sixth resistors respectively.

18. The differential amplifier as claimed in claim 17, wherein the third and fourth PMOS transistors are configured to conduct the first partial current when voltage levels at the third and fourth nodes exceed the common mode voltage by the respective threshold voltages of the third and fourth PMOS transistors.

19. The differential amplifier as claimed in claim 17, wherein a seventh resistor is coupled between the third node and a supply source, while a eighth resistor is coupled between the fourth node and the supply source respectively.

20. A method for amplifying a differential input signal, the method comprising:
providing the differential input signal to first and second input sections; and
generating, at a biasing sub-circuit, an amplified differential output signal based on signals received from the first and second input sections;
wherein the differential input signal includes a common mode voltage, and a partial current is steered from one input section to the other input section at a first range of the common mode voltage, and vice versa at a second range of the common mode voltage.

21. A low voltage differential signaling receiver comprising:
a differential amplifier;
a comparator configured to receive a differential output signal from the differential amplifier for generating a single ended output signal; and
a level shifter circuit configured to receive the single ended output signal for shifting the single ended output signal to a core supply level;
wherein the differential amplifier includes:
first and second input sections configured to receive a differential input signal, the differential input signal including a common mode voltage;
a biasing sub-circuit configured to generate an amplified differential output signal based on signals received from the first and second input sections;
wherein a partial current is steered from one input section to the other input section at a first range of the common mode voltage, and vice versa at a second range of the common mode voltage.

22. A device including a differential amplifier as claimed in claim 1.

23. The device as claimed in claim 22, including one of a differential receiver, an LVDS receiver, a folded cascode structure, and a differential input stage.

24. An amplifier, comprising:
a first input stage configurable to generate, in response to a differential input signal, a first differential intermediate signal having a common mode component with a common-mode phase;
a first compensation stage configurable to generate, in response to the differential input signal, a first differential compensation signal having a common mode component with an offset phase approximately opposite to the common-mode phase; and
an output stage configurable to generate an output signal in response to the intermediate and compensation signals.

25. The amplifier of claim 24 wherein:
the first input stage is configurable to generate, in response to the differential input signal, the first differential intermediate signal having a differential component with a differential-component phase; and
the first compensation stage is configurable to generate, in response to the differential input signal, the first differential compensation signal having a differential component with approximately the differential-component phase.

26. The amplifier of claim 24 wherein the output stage includes a cascoded stage.

27. The amplifier of claim 24 wherein the output stage includes:
a first set of differential input nodes configured to receive the first differential intermediate signal; and
a second set differential of input nodes configured to receive the first compensation signal.

28. The amplifier of claim 24, further including:
a second input stage configurable to generate, in response to the differential input signal, a second differential intermediate signal having a common mode component with approximately the common-mode phase;
a second compensation stage configurable to generate, in response to the differential input signal, a second differential compensation signal having a common mode component with approximately the offset phase; and
wherein the output stage is configurable to generate the output signal in response to the second intermediate and compensation signals.

29. The amplifier of claim 28 wherein the output stage includes:
a first set of differential input nodes configured to receive the first differential intermediate signal and the second compensation signal; and
a second set differential of input nodes configured to receive the second differential intermediate signal and the first compensation signal.

30. The amplifier of claim 28, further including:
a first bias circuit configured to provide a bias signal to the first input stage and second compensation stage; and
a second bias circuit configured to provide a bias signal to the second input stage and first compensation stage.

31. A receiver, comprising:
an amplifier configurable to receive a differential input signal, the amplifier including:
an input stage configurable to generate, in response to the differential input signal, a differential intermediate signal having a common mode component with a common-mode phase;
a compensation stage configurable to generate, in response to the differential input signal, a differential compensation signal having a common mode component with an offset phase approximately opposite to the common-mode phase; and
an output stage configurable to generate a differential output signal in response to the intermediate and compensation signals;
a converter configurable to convert the differential output signal into a single-ended output signal having a level; and
a level shifter configurable to alter the level of the single-ended output signal.

32. A system, comprising:
a receiver, including:
an amplifier configurable to receive a differential input signal, the amplifier including:
an input stage configurable to generate, in response to the differential input signal, a differential intermediate signal having a common mode component with a common-mode phase;
a compensation stage configurable to generate, in response to the differential input signal, a differential compensation signal having a common mode component with an offset phase approximately opposite to the common-mode phase; and
an output stage configurable to generate a differential output signal in response to the intermediate and compensation signals;
a converter configurable to convert the differential output signal into a single-ended output signal having a level; and
a level shifter configurable to alter the level of the single-ended output signal; and
an integrated circuit coupled to the receiver.

33. The system of claim 32 wherein the receiver and integrated circuit are disposed on a same die.

34. The system of claim 32 wherein the receiver and integrated circuit are disposed on respective dies.

35. The system of claim 32 wherein the integrated circuit includes a controller.

36. A method, comprising:
generating, in response to a differential input signal, a first differential intermediate signal having a common mode component with a common-mode phase;
generating, in response to the differential input signal, a first differential compensation signal having a common mode component with an offset phase approximately opposite to the common-mode phase; and
generating an output signal in response to the intermediate and compensation signals.

37. The method of claim 36 wherein:
generating the first differential intermediate signal includes generating the first differential intermediate signal having a differential component with a differential-component phase; and
generating the first differential compensation signal includes generating the first differential compensation signal having a differential component with approximately the differential-component phase.

38. The method of claim 36, further including:
generating, in response to the differential input signal, a second differential intermediate signal having a common mode component with approximately the common-mode phase;
generating, in response to the differential input signal, a second differential compensation signal having a common mode component with approximately the offset phase; and
wherein generating the output signal includes generating the output signal in response to the second intermediate and compensation signals.

39. The method of claim 38 wherein:
generating the first compensation signal reduces stress on a circuit that generates the second intermediate signal; and
generating the second compensation signal reduces stress on a circuit that generates the first intermediate signal.

* * * * *